United States Patent
Dougan et al.

(10) Patent No.: US 6,884,639 B2
(45) Date of Patent: Apr. 26, 2005

(54) SEMICONDUCTOR WAFER POD

(75) Inventors: James Dougan, Round Rock, TX (US); Volker Tegeder, Dresden (DE)

(73) Assignees: Infineon Technologies AG, Munich (DE); Motorola Inc., Schaumburg, IL (US); Infineon Technologies SC30C GmbH & Co. KG, Dresden (DE)

( * ) Notice: Subject to any disclaimer, the term of this patent is extended or adjusted under 35 U.S.C. 154(b) by 73 days.

(21) Appl. No.: 10/262,181

(22) Filed: Sep. 30, 2002

(65) Prior Publication Data

US 2003/0062578 A1 Apr. 3, 2003

Related U.S. Application Data

(63) Continuation of application No. PCT/EP01/02504, filed on Mar. 6, 2001.

(30) Foreign Application Priority Data

Mar. 28, 2000 (EP) .............................................. 00106747

(51) Int. Cl.[7] ........................ H01L 21/00; B65G 49/07; B23Q 3/16
(52) U.S. Cl. ............................. 438/14; 414/DIG. 938; 269/288
(58) Field of Search ...................... 438/5–18; 324/765; 700/121; 356/244, 311, 600, 601, 237.2, 237.3, 237.4, 237.6; 269/287, 288; 414/935, 837, 938, 940; 250/492.1, 492.2

(56) References Cited

U.S. PATENT DOCUMENTS

| | | | |
|---|---|---|---|
| 5,266,812 A | 11/1993 | Mokuo | |
| 5,308,993 A | 5/1994 | Holman et al. | |
| 5,905,302 A | 5/1999 | Lane et al. | |
| 5,980,188 A | 11/1999 | Ko et al. | |
| 6,053,983 A | 4/2000 | Saeki et al. | |
| 6,082,949 A * | 7/2000 | Rosenquist | 414/217 |
| 6,082,951 A * | 7/2000 | Nering et al. | 414/217.1 |
| 6,164,894 A * | 12/2000 | Cheng | 414/416.03 |
| 2002/0118365 A1 * | 8/2002 | Kessel et al. | 356/445 |

FOREIGN PATENT DOCUMENTS

| | | |
|---|---|---|
| WO | WO 98/59229 | 12/1998 |
| WO | WO 99/49502 | 9/1999 |

* cited by examiner

Primary Examiner—Evan Pert
(74) Attorney, Agent, or Firm—Laurence A. Greenberg; Werner H. Stemer; Ralph E. Locher

(57) ABSTRACT

A semiconductor wafer pod includes a measurement sensor configured within a housing. The sensor faces towards a surface of a wafer being accommodated in the pod. The pod can be connected to the conventional load-port of a semiconductor wafer manufacturing tool. Thereby, measurement data can be collected immediately after wafer processing without a need to transport the wafer. The invention enables the cost-effective development of tool-integrated metrology.

21 Claims, 5 Drawing Sheets

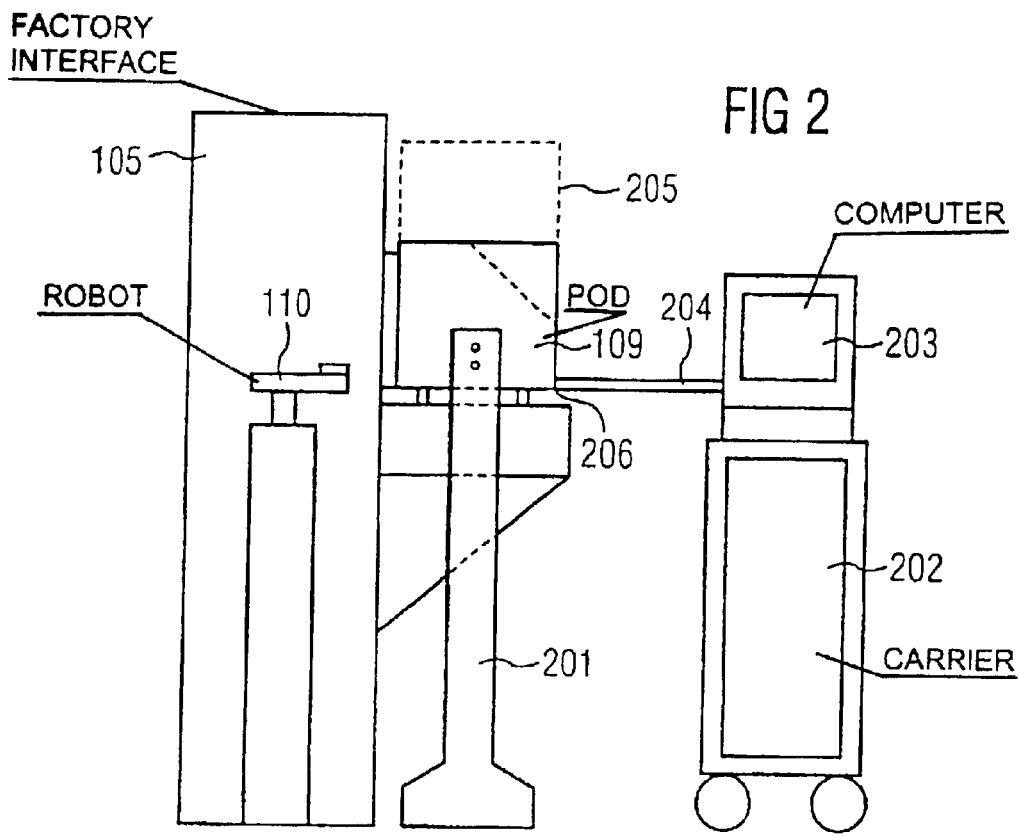
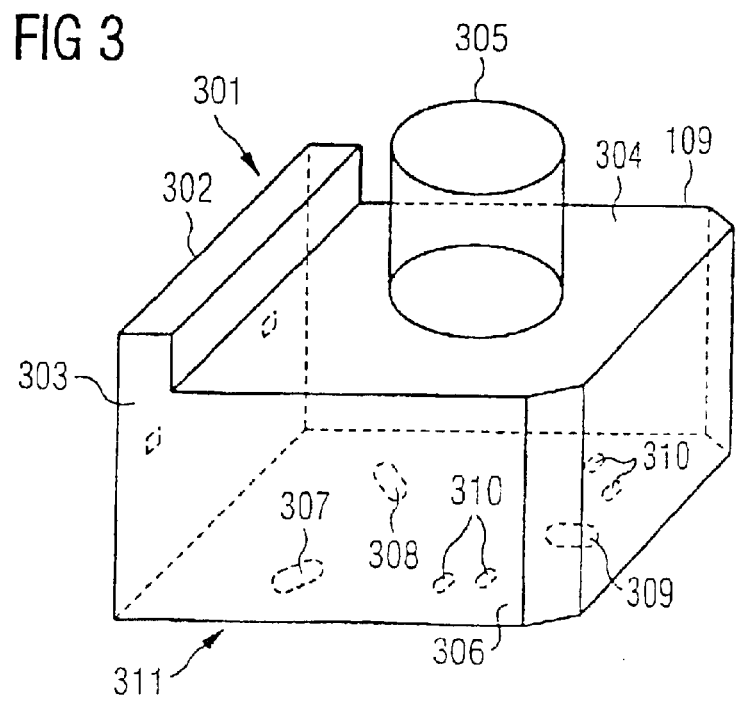

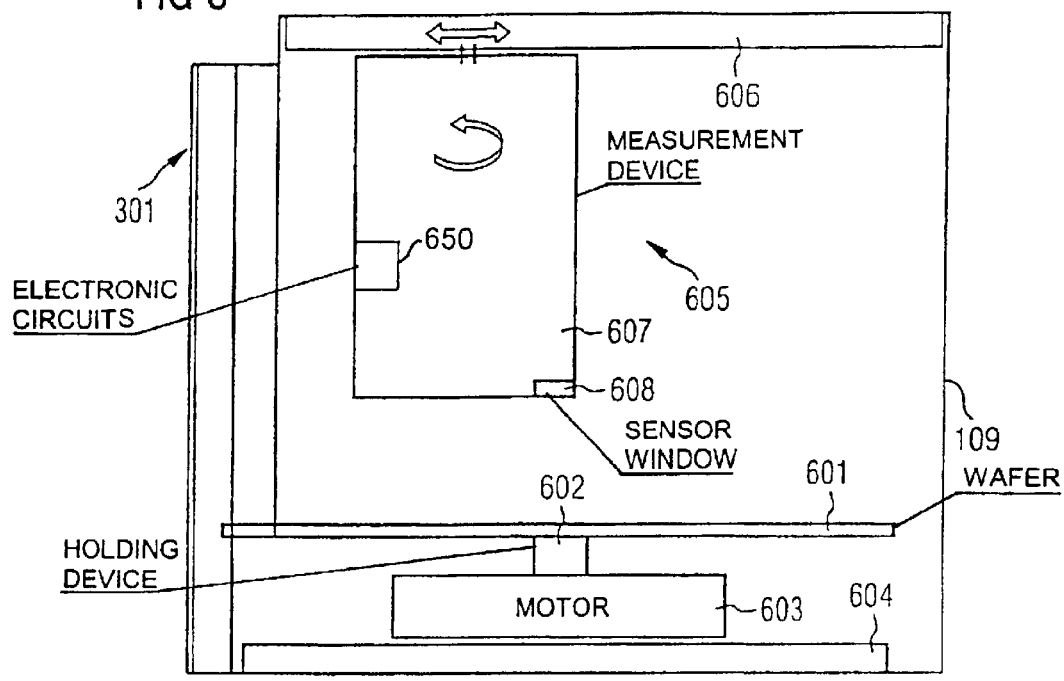
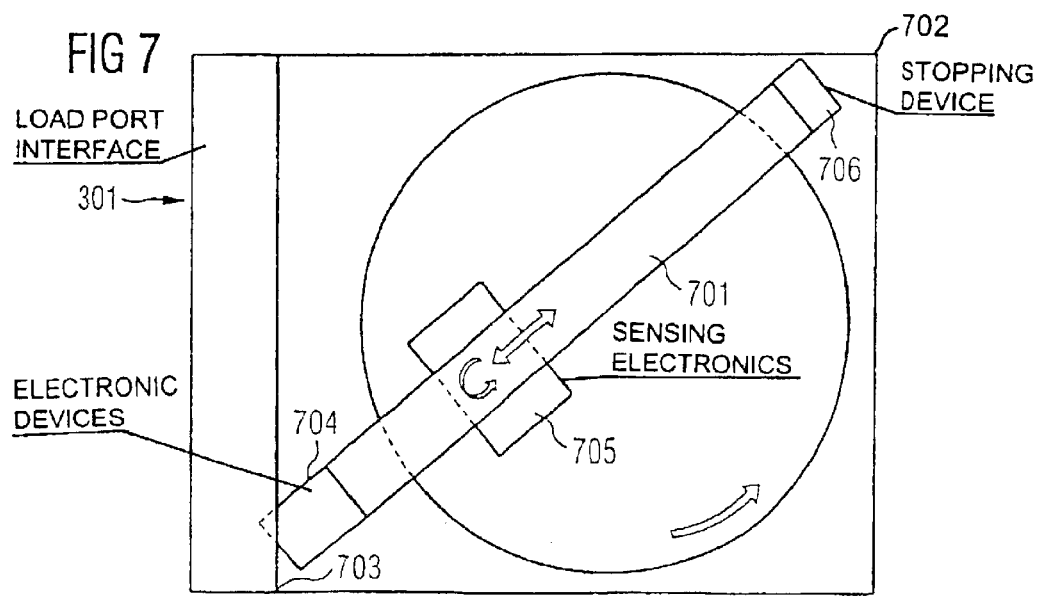

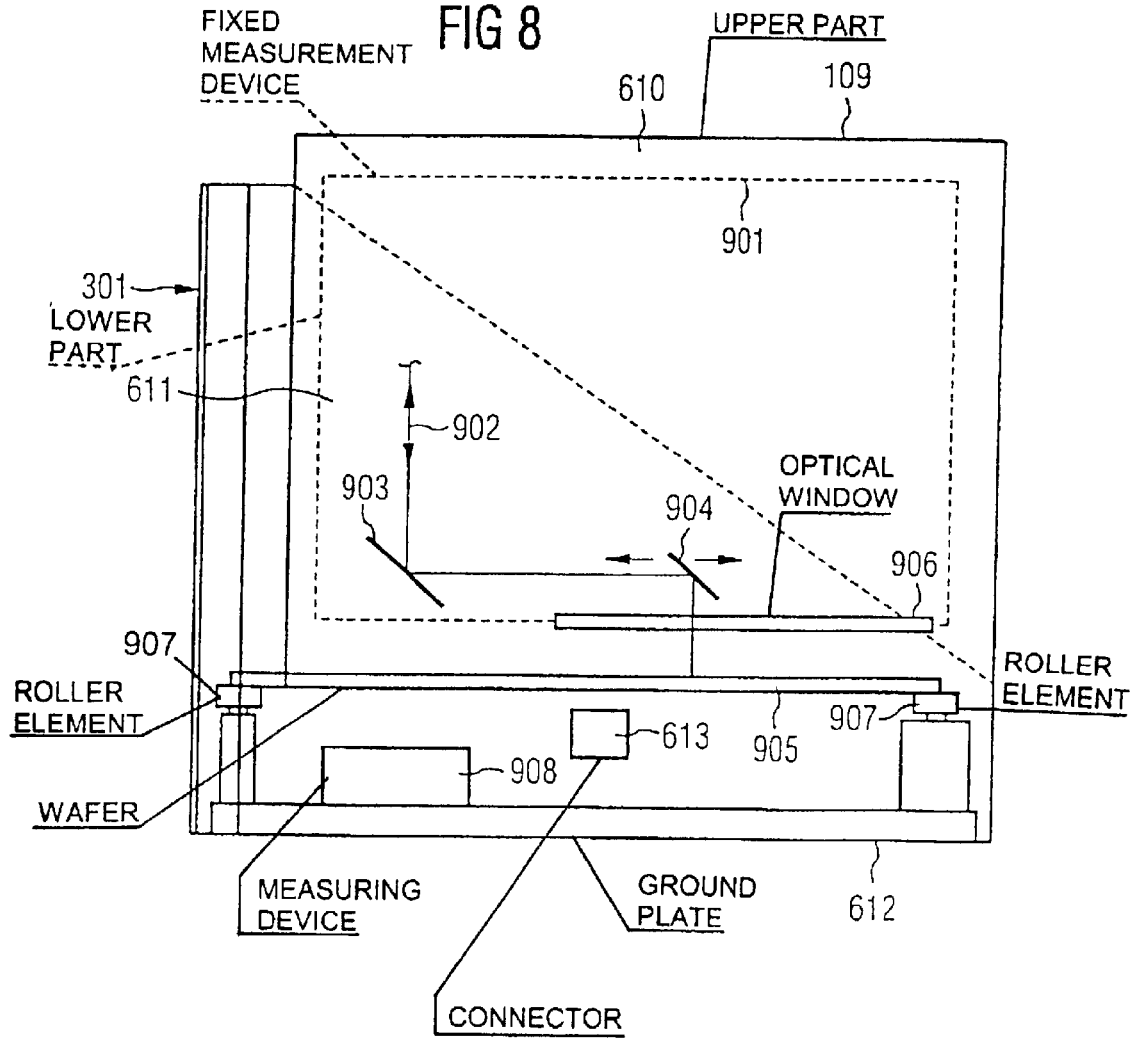

SEMICONDUCTOR WAFER POD

CROSS-REFERENCE TO RELATED APPLICATIONS

This application is a continuation of copending International Application No. PCT/EP01/02504, filed Mar. 6, 2001, which claims priority to European Application Publication Number EP 1139 390 A1, filed Mar. 28, 2000.

BACKGROUND OF THE INVENTION

Field of the Invention

The invention relates to a pod for accommodating a semiconductor wafer. This pod will be mechanically connected to the pod interface of a semiconductor manufacturing tool. The invention also refers to a method for performing a measurement on a wafer.

In a semiconductor factory, wafers are stored and transported from one tool to another tool in a pod. The pods are standardised, so that the same pod is attachable to tools from different vendors. For manufacturing 200 mm wafers, open cassette pods or SMIF pods are used. An open cassette is a container in which a number of wafers are configured in parallel to each other. The open cassette is transported with the wafers oriented almost vertically. The open cassette is attached to a tool after being rotating by 90°. In 300 mm production, a so called FOUP (front opening unified pod) is used. The pod contains a number of 300 mm semiconductor wafers that are hermetically sealed within the pod, since the ambient air in the pod might have a better clean room class than the air outside the pod. The wafers are oriented horizontally in that pod, facing to an opening that is sealed by a door. When attached to the interface section of a tool, the door is removed and the wafers can be accessed by a wafer handler. In any case, the interface section and most of the geometric characteristics of the tool comply with various standards.

During semiconductor wafer manufacturing, the wafers have to be tested in order to monitor the quality of the process steps that have already been performed. For example, such measurements include measuring film thickness, contamination by number and location of particles, critical dimensions, etc. In the semiconductor manufacturing industry, measurement tool suppliers of integrated measurements are typically small engineering companies, who have difficulties integrating their measurement apparatuses into expensive and advanced manufacturing tools. In particular, cluster tools for CVD (chemical vapor deposition), plasma etch or lithography are highly automated and are very expensive. When measurement tools are required to be integrated into manufacturing tools, there is a necessity to test the measurement equipment and its behaviour and interaction within the manufacturing tool during development. Currently, measuring sensors are integrated with a large effort into the tools after some preliminary tests at a laboratory site. Since there is no effective test of the sensor system in production environment, it is hard to convince the manufacturing tool supplier to integrate the measurement sensor system into his tool. On the other hand, when testing the measurement system in the production environment, the integration cost will add up to a huge amount. Therefore, the development and integration of metrology into manufacturing tools is very costly and difficult to realize.

In International Publication WO 98/59229, a semiconductor pod is shown that includes sensors mounted to the housing of the pod in order to monitor the environment within the pod. Signals from the sensors are provided to a logging device that stores them for later retrieval or transmission. The sensors can monitor light intensity or spectrum, gases, particles and other properties of the environment within the wafer pod.

SUMMARY OF THE INVENTION

It is accordingly an object of the invention to provide a device for facilitating the development and introduction of metrology equipment into existing semiconductor wafer manufacturing tools. In particular, it is an object of the invention to provide a pod for accommodating a semiconductor wafer and an easy method for performing a measurement on a semiconductor wafer.

With the foregoing and other objects in view there is provided, in accordance with the invention, a pod for accommodating a semiconductor wafer. The pod includes: a housing; an interface section for mechanically coupling to a pod interface of a semiconductor wafer manufacturing tool; a holding device configured within the housing for holding the semiconductor wafer within the housing; and a measurement sensor configured for facing towards a surface of the semiconductor wafer in order to interact with the surface of the semiconductor wafer.

In accordance with an added feature of the invention, the holding device includes a rotational device for rotating the semiconductor wafer.

In accordance with an additional feature of the invention, the housing forms an inner space; and the rotational device is configured for moving the semiconductor wafer into and out of the inner space of the housing.

In accordance with another feature of the invention, the rotational device is configured for rotating the semiconductor wafer while moving the semiconductor wafer into the inner space of the housing.

In accordance with a further feature of the invention, the rotational device is configured for rotating the semiconductor wafer while moving the semiconductor wafer out of the inner space of the housing.

In accordance with a further added feature of the invention, a shifting device is attached to the measurement sensor for shifting the measurement sensor above the surface of the semiconductor wafer.

In accordance with a further additional feature of the invention, there is provided, an interface section having a plane surface for connecting to the semiconductor manufacturing tool, the shifting device extending in a linear direction perpendicularly crossing the plane surface of the interface section.

In accordance with an added feature of the invention, the housing has a first corner and a second corner that is diagonally opposite the first corner; and the shifting device extends in a linear direction across the semiconductor wafer from the first corner of the housing to the second corner of the housing In accordance with an additional feature of the invention, the housing forms an inner space; and the measurement sensor is rotated around an axis perpendicular to the surface of the semiconductor wafer, when the semiconductor wafer is moved into the inner space of the housing.

In accordance with another feature of the invention, the housing forms an inner space; and the measurement sensor is rotated around an axis perpendicular to the surface of the semiconductor wafer, while the measurement sensor is shifted across the surface of the semiconductor wafer.

In accordance with a further feature of the invention, a mirror is provided. The measurement sensor is fixed within the housing for emitting and receiving a light beam impinging on the surface of the semiconductor wafer. The mirror is configured for being shifted above the surface of the semiconductor wafer for reflecting the light beam onto and from the surface of the semiconductor wafer.

In accordance with a further added feature of the invention, the housing has a side wall, a ground wall, and a top wall; the measurement sensor includes a sensor device for interacting with the surface of the semiconductor wafer and for providing a signal; the measurement sensor includes a processing device for processing the signal from the sensor device; and the processing device extends through a wall selected from a group consisting of the side wall, the ground wall, and the top wall.

In accordance with yet an added feature of the invention, there is provided, an electrical connector coupled to the measurement sensor. The connector is for forming an electrical interface from the measurement sensor to an external evaluation device positioned outside the housing. The connector is configured in one of the walls of the housing.

In accordance with yet an additional feature of the invention, the housing has a bottom part for accommodating the interface section and for accommodating the semiconductor wafer; and the housing has a top part that is removable from the bottom part.

In accordance with yet another feature of the invention, there is provided, a device for holding a second semiconductor wafer. The measurement sensor is configured between the first semiconductor wafer and the second semiconductor wafer. The measurement sensor is rotatable about a rotational axis located between the first semiconductor wafer and the second semiconductor wafer.

In accordance with yet a further feature of the invention, the measurement sensor defines a first measurement sensor configured to provide a signal, and the pod includes: a further measurement sensor configured to face towards the surface of the semiconductor wafer. The second measurement sensor is controlled in response to the signal provided by the first measurement sensor.

In accordance with yet an added feature of the invention, the pod is constructed to comply with the SEMI standard No. E57 or the SEMI standard No. E19.

In accordance with yet another feature of the invention, the pod interface of the semiconductor wafer manufacturing tool includes a load-port that complies with SEMI standard No. E15.

With the foregoing and other objects in view there is also provided, in accordance with the invention, a method for performing a measurement on a semiconductor wafer located on a semiconductor wafer manufacturing tool. The method includes steps of: providing the semiconductor wafer manufacturing tool with: a chamber for processing the wafer, a first interface for receiving a first pod accommodating at least the wafer, a second interface for receiving a second pod, and a wafer handler; providing the second pod with: a housing, an interface section for mechanically coupling to the second interface of the semiconductor wafer manufacturing tool, a holding device configured within the housing for holding the wafer within the housing, and a measurement sensor configured for facing towards a surface of the wafer in order to interact with the surface of the wafer; removing the wafer from the first pod; placing the wafer into the chamber; processing the wafer in the chamber; placing the wafer into the holding device in the second pod at a time selected from a group consisting of before performing the step of processing the wafer and after performing the step of processing the wafer; performing a measurement with the measurement sensor in the second pod; and placing the wafer back into the first pod.

In accordance with an added mode of the invention, the method includes steps of: obtaining a signal when carrying out the step of performing the measurement; and controlling a parameter for the step of processing the wafer in response to the signal obtained when carrying out the step of performing the measurement.

The pod that is normally used to provide wafers to be processed to a manufacturing tool has least a wafer and a measurement sensor configured within the pod. Thereby, the measurement can be performed on the tool immediately after processing the wafer. The metrology is performed via the standardised interface by which the pod is connected to the tool. Since there are usually more pod interfaces on the tool, some of which are not used to provide wafers for processing, the inventive pod can be attached to a free load-port interface. The manufacturing process is not interrupted. Overall, the inventive pod is provided to the load-port of the tool, and as seen from the tool, it behaves similar to a pod that carries wafers that will be processed.

An advantage of the invention is that for certain measurement actions like particle tests, a layer thickness measurement, or a critical dimension measurement during process development, an immediate measurement is accomplished without the need to transport the wafer. This reduces the time needed for process development and also reduces the work load for stand-alone measurement tools that would be needed otherwise and that are usually very highly priced. In any case, the sensor is configured to face onto a surface of the wafer. The surface of the wafer includes the front side, the back side as well as the edge of the wafer. The measurement technique requires that the sensor interact with the surface or the edges of the wafer. The interaction is preferably in a direct way, for example, by means of mechanical or optical interaction. The invention is especially useful, when the sensor provides an optical signal that is reflected or scattered by the surface or the edge of the wafer and is received by a receptor. In any case, the invention interacts with the wafer to measure a wafer property.

The modifications to the manufacturing tool are very reasonable. There are no or only minor hardware modifications necessary, since the modification is outside the tool in the pod. The only modification applies to a change in the control software for the wafer handling device, which is relatively easy and much less complicated than changing the process control software of the processing section of the tool. Since the metrology sensor system can be tested and improved and debugged on the manufacturing tool itself, it is much easier to integrate the sensor at other locations in the tool after a successful test. The sensor system in the inventive pod would even be suited to perform tool integrated measurement during mass production. The sensor system can stop the tool operation when the measurement results are beyond a specified range, thereby enabling runtime control of the tool performance and easy fault detection. The invention can be applied to any pod that carries semiconductor wafers during wafer manufacturing in a factory. Practically, the invention may be used for 200 mm open cassettes and SMIF pods, as well as for 300 mm FOUPs. Depending on the size of the metrology tool, either the full system can be integrated into the pod or the only the sensor is integrated into the pod and the measurement signals are evaluated outside the pod in a computer. During the development phase of the measurement system, the hardware can be down sized or custom-designed to fully fit into the housing of the pod. A wall of the housing can be provided with an adapter, so that different sensors can be attached. The adapter can be mounted on any wall of the pod housing, including top, left, right, bottom, etc. facets of the housing. This provides the capability to inspect or measure features on every side of the wafer, including the front side, the back side, and the edge of the wafer. Alternatively the housing may have two parts with a matching interface. One part carries the sensor and is detachable from the other part, so that different sensors can be exchanged easily.

According to 300 mm FOUPs, the standard provides an option for a mechanical coding of FOUP characteristics via coupling grooves in the bottom plate of the housing. Thereby, the manufacturing tool can check the properties of the FOUP and switch the program of the wafer handler for correctly interfacing with the pod incorporating the measurement sensor.

In the following, different preferred embodiments of the invention are described. The pod preferably contains a device for rotating the wafer. This rotational device is preferably configured in the bottom section of the pod. For mechanically decoupling vibrations that are introduced from the manufacturing tool, a heavy weight is carried by the bottom plate of the housing of the pod, for example, a plate made of stone or granite or a shock absorbing apparatus. The wafer can be moved in and out of the housing of the pod for performing a measurement along the movement path of the sensor across the wafer. When being rotated while moving in and/or out of the pod, all locations on the upper or the lower surface of the wafer can be inspected by the measurement sensor. The sensor may also be attached to a shifting device that moves the sensor across a surface of the wafer. The shifting device may provide a linear movement of the sensor. The sensor may be moved in a direction perpendicular to the plane face of the interface section of the pod. When rotating the wafer and shifting the sensor across the diameter of the surface of the wafer, it is possible to inspect all locations on the wafer. The moving direction can also form an angle with respect to the direction perpendicular to the plane interface section, so that there is space provided for a respective stopping device for stopping the movement of the sensor at the ends of the shifting device.

In either case, the sensor may further be rotated about an axis attached to the shifting device. The sensor may also be permanently fixed or rotationally fixed within the housing without any capability to shift. Hereby, all locations on the wafer can be inspected by the sensor when the wafer is rotated while being inserted into the pod.

When the pod includes a holding device for holding several wafers, the wafers should be suitably spaced, so that sensors can be placed between the wafers. When rotating the sensor on an axis that is located between the wafers, the sensor can scan the upper surface of the lower wafer and the sensor can subsequently scan the bottom surface of the upper wafer.

When computational equipment or other electronic devices, e.g. for measurement control and signal treatment, do not fit into the housing of the pod, an electrical connector of matching plugs is preferably mounted to one of the walls of the housing of the pod. Thereby, easy connection to a stand-alone computer is enabled.

When using the inventive pod, a first pod carrying wafers to be processed is attached to a first load-port. The second load-port has the pod with the sensor. A wafer is taken out of the first pod by a wafer handler and is transported to a processing chamber, e.g. a CVD-chamber or a plasma etch chamber or another manufacturing equipment. The processed wafer is then transported to the second pod including the sensor, and a measurement is performed. Data are collected for further processing and evaluation. The data may also be used as an input signal into the tool to regulate any tool parameters in order to optimise the processing of further wafers. In addition to that or alternatively, the wafer can be placed into the second pod for performing a pre-measurement before being processed.

Other features which are considered as characteristic for the invention are set forth in the appended claims.

Although the invention is illustrated and described herein as embodied in a semiconductor wafer pod, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a side-view of the manufacturing tool with an inventive pod;

FIG. 3 is a perspective view of a pod;

FIG. 6 is a side-view of another pod;

FIG. 7 is a top-view of a pod with a shifting device; and

FIG. 8 is a side-view of a pod with another sensor device.

DESCRIPTION OF THE PREFERRED EMBODIMENTS

Figure 1:
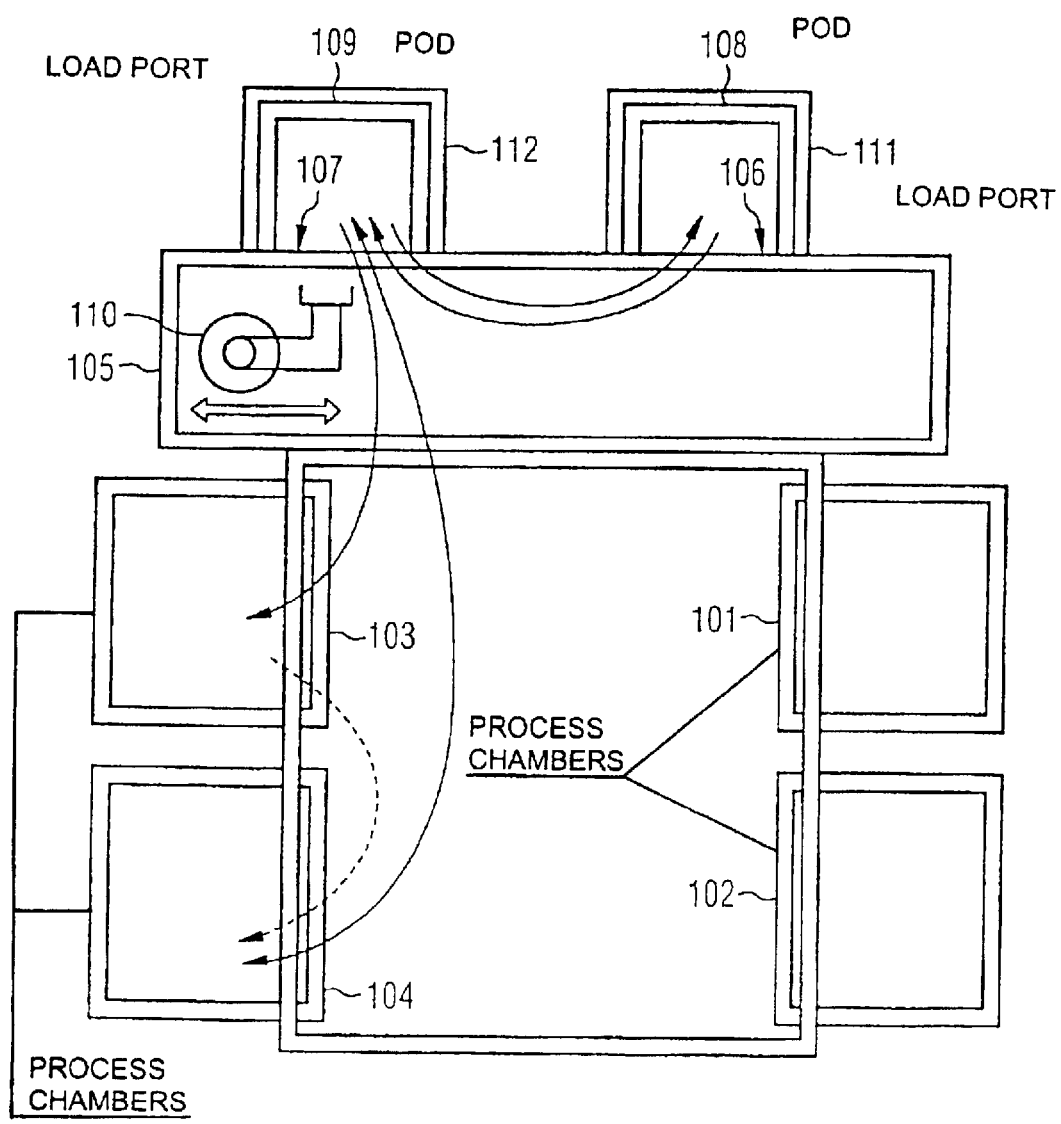
FIG. 1 is a top view of a semiconductor wafer manufacturing tool.

Referring now to the figures of the drawing in detail and first, particularly, to FIG. 1 thereof, there is shown a cluster tool with different process chambers 101, 102, 103, 104. Different process chambers may be used for different processing steps during the manufacturing of semiconductor wafers. The processing chambers are provided with wafers through a factory interface 105. Pods containing a number of wafers are connected to the factory interface 105. The load-ports 111 and 112 have a standardized interface 106 and 107, respectively, that fit to the pods. In the example, the pods may be designed as a standard FOUP (front opening unified pod) for 300 mm wafers. The load-port 106 is provided with a FOUP 108 containing the wafers that will be processed. The load-port 107 is provided with an inventive pod 109. This pod contains a measurement sensor.

During wafer manufacturing, the wafer is taken out of the pod 108 at load-port 111 by a robot 110 and is inserted into pod 109 to perform a pre-measurement, if needed. Then the wafer is inserted into process chamber 103 and optionally into process chamber 104 for a processing step where the surface of the wafer is treated. These processing steps may involve chemical vapor deposition (CVD), etching, or other processing steps. After the last processing step, the wafer is again inserted into pod 109 for an after-processing measurement. Finally the wafer is returned to the conventional pod 108. The measurement performed in the pod 109 may be a thickness measurement with a reflectometer, an ellipsometer, or a spectrophotometer. Other possible measurement methods may be a particle measurement showing the distribution and number of particles or a critical dimension measurement via light scatterometry as well as a measurement of temperature, a raman spectroscopy, an overlay, scatterometry or other measurement techniques. Depending on the measurement method, a fault detection can be performed or the tool can be tuned and re-adjusted to optimal processing performance. The preferred measurement techniques involve the optical interaction of the sensor with the wafer. Preferably, the sensor system sends out a light beam that hits the wafer surface and that is reflected or scattered and detected by a receptor within the sensor system.

Referring to FIG. 3, the inventive FOUP complies to the standardised parameters, especially the SEMI standard no. E57 (kinematic coupling pins), E15 (load-port), and E19 (FOUP). In particular, the vertical and horizontal interface sections 301 and 311 are fully compatible with the standard features of a load-port, so that the pod can be attached to the load-port of the manufacturing tool in a conventional manner. The load-port includes a plane, even front side that fits to the corresponding opening at the load-port of the tool. Wafers can be provided to the tool via the opening of the interface. The 300 mm wafer FOUP as well as the measurement pod are closed when idle. A door 303 is removed in the factory interface 105 of the tool to provide access for the wafer handler 110. It is important that the pod is closed when detached from the manufacturing tool, so that the inner space of the pod is not contaminated with air of the surrounding clean room which might have higher particle contamination than the inside area of the pod and the manufacturing tool. The upper cover wall 304 of the housing of the pod can be removed. A sensor 305 is fixed to the cover 304 of the FOUP housing. The housing is provided with an adapter to which the sensor is attached. When a measurement with a different sensor is desired, the sensor from the previous measurement is removed and another sensor is attached to the adapter. Alternatively, the cover 304 can be replaced by another cover with a different sensor. The adapter as well as the sensor can be configured on any wall of the housing of the pod. The bottom plate 306 of the FOUP has three kinematic coupling grooves 307, 308 and 309 that serve for the exact alignment of the pod. There are also provided four holes 310 which provide a code for the type of the pod. The holes 310 are checked by the load-port 112. This enables the wafer handler 110 to switch to the correct control program that operates the wafer handler 110. In that way, the wafer handler knows which position inside the pod is reserved for receiving the wafer. Also, a fixed time delay for the measurement procedure can be set after which the wafer can be removed from the pod. Alternatively, the holes may be equipped with a mechanical switch that is controlled by the measurement equipment in the pod. The switch is operated when the measurement procedure is finished thereby indicating to the tool that the wafer can be removed from the pod.

The side-view to the tool of FIG. 2 shows a foot 201 for stabilizing the pod 109. Especially, when the pod 109 is heavily loaded with equipment, the stabilizing foot 201 supports the pod, so that the wafer to be measured in the pod 109 has a horizontal position and can be conveniently accessed by the handler 110. Rolls can be attached to the foot so that the pod can be pushed on the ground floor. When equipment for processing the signals provided by the sensor inside the pod 109 does not fit into the pod, an additional carrier 202 outside the tool is provided to carry a computer 203 or additional electronic devices. The computer and/or electronic devices 203 is connected via a cable 204 to the electronic circuits and the sensor inside the pod 109. Also, power can be provided to the pod via cable 204. The pod includes a connector 206 to which a corresponding plug from cable 204 can be connected.

The pod 109 may have a standard height corresponding to the height of a 13- or 25-wafer FOUP. Depending on the type of the sensor inside the pod, the back side wall may have an oblique upper section. The pod may also be extended in the vertical direction indicated with numeral 205 to accommodate the sensor and electronic equipment. Preferably, a display is attached to the pod housing to provide status information or measurement results to the operator. With the stabilizing foot 201 being installed, it is also possible to set the computer 203 on top of the pod 109. Since the dimensions in the vertical direction are relatively unrestricted and may be limited by the requirement of overhead transport systems only, this provides the opportunity to install computational equipment or displaying devices onto the pod.

Figure 4:
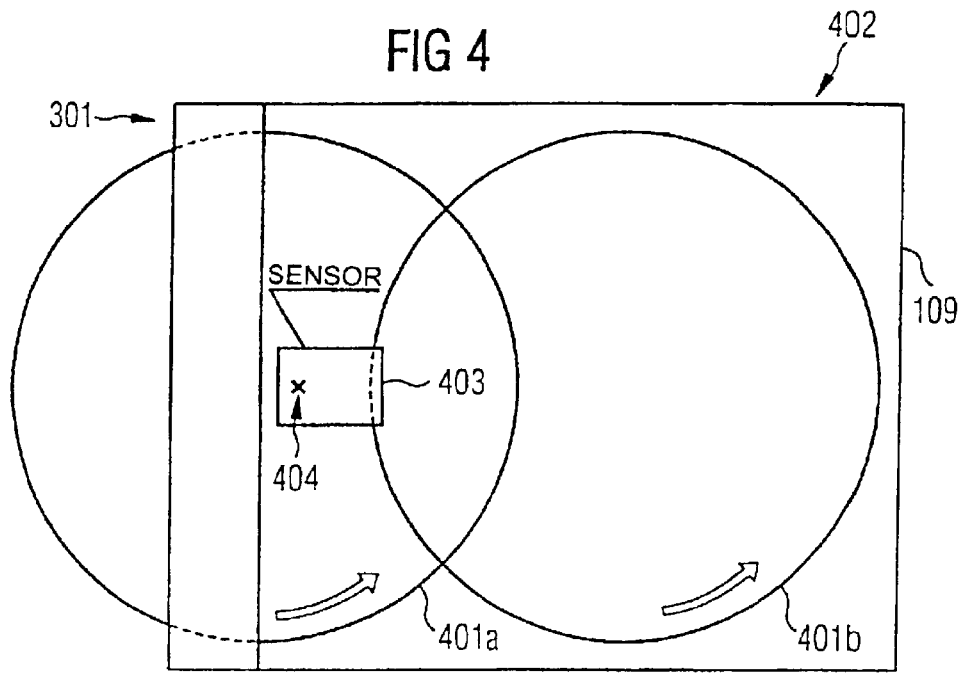
FIG. 4 is a top view of a pod with a wafer shown in two different positions.

FIG. 4 shows a top view onto an inventive pod 109. A wafer 401 is shown in two positions 401a and 401b. While the wafer is moved into the inner space of the pod housing 402 by a wafer handling device installed in the pod 109, it is rotated by the handling mechanics. This enables the sensor 403 to scan over the full surface of the wafer while rotating and being moved into the FOUP. In addition, the sensor may be rotated around an axis 404. The eccentric rotation of the sensor 403 may be stepwise or continuous. The wafer handler may have a light emitting diode that senses reflections from inside the pod to determine which position of the pod carries a wafer. Light absorbing material should be attached to the parts of the pod that are above and below the inserting position of the wafer. The light absorbing material signals to the wafer handler that only the reflecting position of the pod needs to be accessed and the remainder of the possible wafer positions that absorb the light from the diode are not occupied by any wafers.

Figure 5:
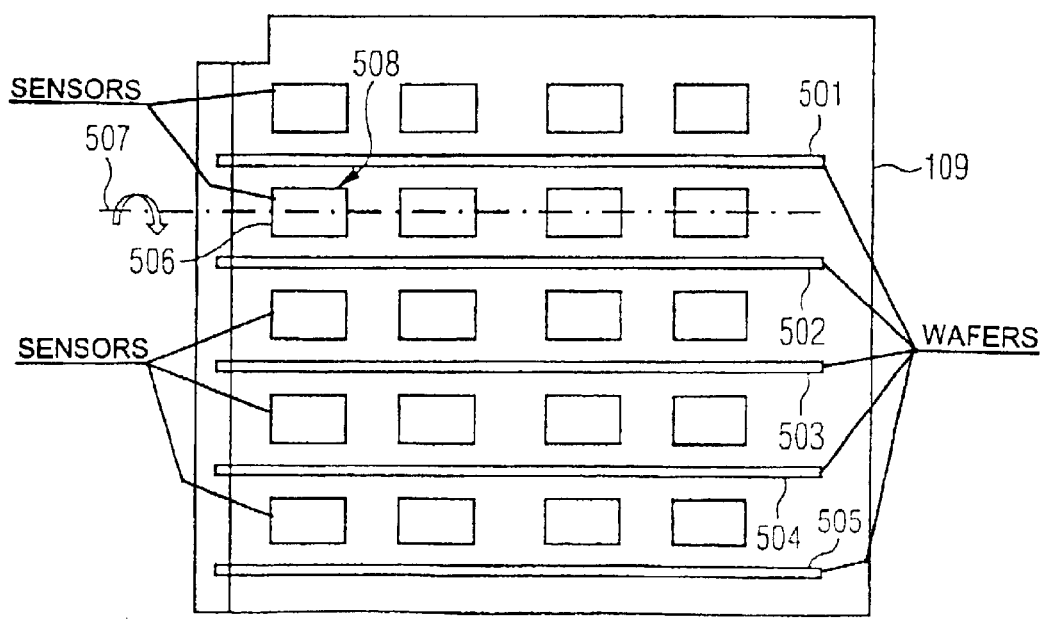
FIG. 5 is a side-view of a pod with several wafers and several sensors.

Referring now to FIG. 5, a pod 109 is shown with several wafers 501, ..., 505. Between two wafers, e.g. 501 and 502, at least one sensor 506 is configured. The sensor 506 is fixed to a rotational axis 507 which extends in parallel between wafers 501 and 502. The measuring interface 508 of sensor 506 first measures the back side of wafer 501. Then, the sensor is rotated around axis 507 by 180°, so that the measurement interface 508 faces the upper surface of wafer 502. With the exception of the sensors above wafer 501, all the other sensors in between two wafers in the pod 109 operate in the same way. Also, each of the wafers is rotated around the same vertical axis.

FIG. 6 shows a cross-sectional view through another FOUP 109, detailing different aspects of the invention. A wafer 601 is fixed to a holding mechanism 602, which is driven by a motor 603. The motor is configured on a heavy plate 604, which lies on the ground section of FOUP 109. The plate 604 is a metal plate or is made of stone, especially granite. The plate 604 prevents any vibration caused by the rotation of the wafer 601 from coupling into the manufacturing tool. Preferably, the measurement equipment 605 stands on the plate 604.

Alternatively, the plate can be replaced by a known shock absorbing apparatus. The measurement equipment includes a rail track 606 which is oriented perpendicular to the orientation of the load-port interface 301. A measurement device 607 travels in the rail 606 across the diameter of the wafer 601. The measuring device contains processing devices or electronic circuits 650 that process or evaluate measured signals which are derived from the sensor window 608 of the sensor device. The sensor device may be a Michaelson Interferometer for measuring the deepness of a trench. When the wafer 601 rotates and the sensor 608 is being shifted along the wafer diameter, all locations on the upper surface of the wafer 601 can be inspected. In addition, the measurement device 607 can be rotated around a vertical axis, so that the sensor 608 scans an area of the wafer surface along the travelling direction of the rail 606. The rail 606 may also be shifted across the axis parallel to the orientation of the load-port interface 301. The pod may be extended in the vertical direction if the electronic equipment is too big to fit into the standard height of a conventional FOUP.

FIG. 7 shows a top view of another embodiment of the pod. The travelling rail 701 forms an angle with the orientation of the load-port interface 301 which is different from 90°. The travelling rail 701 extends from one corner 702 of the pod to the other corner 703 which is diagonal to corner 702. With the orientation of the travelling rail 701 shown in FIG. 7, there is enough space in the pod for electronic devices 704 that drive the sensor and sensing electronics 705. Further, there is enough space in order to provide a stopping device 706 that stops the movement of the sensor equipment 705.

FIG. 8 shows a cross section through another embodiment. The housing of the pod 109 contains a fixed measurement device 901, e.g. an FTIR (Fourier Transform Infra-Red Device). An infrared light beam 902 is guided by mirrors 903 and 904. The latter mirror 904 is configured movably so that it can be shifted across the wafer 905 while the sensor is fixed. A light emitting source and a light receptor are fixed within the housing. An optical window 906 enables the infrared light beam 902 to impinge on the upper surface of the wafer 905. The mirror 904 reflects the light beam from the source onto the surface of the wafer and also reflects the wafer reflected light back to the light receptor. The rotation of the wafer 905 is performed by cylindrical roller elements 907. The pod also incorporates a measuring device 908 beneath the wafer 905 for the inspection of the back side of the wafer 905.

Preferably, the pod housing has an upper part 610 and a lower part 611. The part 610 can be detached from the part 611. The lower part 611 includes the load-port interface 301. The borderline between the parts 610, 611 extends from the upper end of the load-port 301 to slightly above the end of the ground plate 612 of the pod housing. Also, other forms of the borderline between the upper and the lower parts of the housing are possible. The lower part 611 of the pod contains the rotation mechanism for the wafer 905. When removing the upper part 610 of the pod, the electronic devices inside can be repaired, adjusted or removed and replaced by different measurement equipment. A connector 613, which is configured in the lower part 611 of the pod, connects the electronics of the measurement device 901 to the rotation motor. The pod of the invention is made of plastic as is the standard FOUP, or of aluminium, or of any material which is clean room compatible.

The pod can be provided with at least two measurement sensors that are attached to an adapter located at the same wall of the pod housing or preferably at different walls of the pod housing. Thereby, simultaneous measurements of two different wafer characteristics are enabled. At least two sensors can be controlled by each other. For example one sensor facing onto the top side of the wafer provides focus information, whereas the other sensor measures any wafer characteristic by inspecting the wafer edge. Another joint measurement technique includes the same type of sensors, which measure the same characteristic of the wafer from different locations or different surfaces of the wafer. The measurement results are combined, providing a single joint value for the wafer characteristic.

As stated above, the single or at least two measurement sensors can be located within the housing if space is available. One of the sensors may be mechanically configured such that the measurement angle with respect to the wafer can be varied, thus enabling multi-angle measurement.

We claim:

1. A pod for accommodating a semiconductor wafer, comprising:

a housing;

an interface section for mechanically coupling to a pod interface of a semiconductor wafer manufacturing tool;

a holding device for holding the semiconductor wafer, said holding device configured within said housing; and a measurement sensor configured for facing towards a surface of the semiconductor wafer in order to interact with the surface of the semiconductor wafer.

2. The pod according to claim 1, wherein: said holding device includes a rotational device for rotating the semiconductor wafer.

3. The pod according to claim 2, wherein: said housing forms an inner space; and said rotational device is configured for moving the semiconductor wafer into and out of said inner space of said housing.

4. The pod according to claim 3, wherein: said rotational device is configured for rotating the semiconductor wafer while moving the semiconductor wafer into said inner space of said housing.

5. The pod according to claim 3, wherein: said rotational device is configured for rotating the semiconductor wafer while moving the semiconductor wafer out of said inner space of said housing.

6. The pod according to claim 1, comprising: a shifting device attached to said measurement sensor for shifting said measurement sensor above the surface of the semiconductor wafer.

7. The pod according to claim 6, comprising: an interface section having a plane surface for connecting to the semiconductor manufacturing tool, said shifting device extending in a linear direction perpendicularly crossing said plane surface of said interface section.

8. The pod according to claim 6, wherein: said housing has a first corner and a second corner that is diagonally opposite said first corner; and said shifting device extends in a linear direction across the semiconductor wafer from said first corner of said housing to said second corner of said housing.

9. The pod according to claim 1, wherein: said housing forms an inner space; and said measurement sensor is rotated around an axis perpendicular to the surface of the semiconductor wafer, when the semiconductor wafer is moved into said inner space of said housing.

10. The pod according to claim 1, wherein: said housing forms an inner space; and said measurement sensor is rotated around an axis perpendicular to the surface of the semiconductor wafer, while said measurement sensor is shifted across the surface of the semiconductor wafer.

11. The pod according to claim 1, comprising:
a mirror;
said measurement sensor being fixed within said housing for emitting and receiving a light beam impinging on the surface of the semiconductor wafer; and
said mirror configured for being shifted above the surface of the semiconductor wafer for reflecting the light beam onto and from the surface of the semiconductor wafer.

12. The pod according to claim 1, wherein:
said housing has a side wall, a ground wall, and a top wall;
said measurement sensor includes a sensor device for interacting with the surface of the semiconductor wafer and for providing a signal;
said measurement sensor includes a processing device for processing the signal from said sensor device; and
said processing device extends through a wall selected from a group consisting of said side wall, said ground wall, and said top wall.

13. The pod according to claim 1, in combination with an evaluation device positioned outside said housing, the pod comprising:
an electrical connector coupled to said measurement sensor;
said connector forming an electrical interface from said measurement sensor to the evaluation device positioned outside said housing;
said housing having walls; and
said connector being configured in one of said walls of said housing.

14. The pod according to claim 1, comprising:
an electrical connector coupled to said measurement sensor;
said connector for forming an electrical interface from said measurement sensor to an external evaluation device positioned outside said housing;
said housing having walls; and
said connector being configured in one of said walls of said housing.

15. The pod according to claim 1, wherein:
said housing has a bottom part for accommodating said interface section and for accommodating the semiconductor wafer; and
said housing has a top part that is removable from said bottom part.

16. The pod according to claim 1, in combination with the semiconductor wafer defining a first semiconductor wafer and in combination with a second semiconductor wafer, the pod further comprising:
a device for holding the second semiconductor wafer;
said measurement sensor configured between the first semiconductor wafer and the second semiconductor wafer;
said measurement sensor being rotatable about a rotational axis located between the first semiconductor wafer and the second semiconductor wafer.

17. The pod according to claim 1, wherein said measurement sensor defines a first measurement sensor configured to provide a signal, and the pod further comprises:
a further measurement sensor configured to face towards the surface of the semiconductor wafer;
said second measurement sensor is controlled in response to the signal provided by said first measurement sensor.

18. The pod according to claim 1, wherein: the pod is constructed to comply with a standard selected from a group consisting of a SEMI standard No. E57 and a SEMI standard No. E19.

19. The pod according to claim 1, in combination with the semiconductor wafer manufacturing tool, wherein: the pod interface of the semiconductor wafer manufacturing tool includes a load-port that complies with SEMI standard No. E15.

20. A method for performing a measurement on a semiconductor wafer located on a semiconductor wafer manufacturing tool, the method comprising:
providing the semiconductor wafer manufacturing tool with: a chamber for processing the wafer, a first interface for receiving a first pod accommodating at least the wafer, a second interface for receiving a second pod, and a wafer handler;
providing the second pod with: a housing, an interface section for mechanically coupling to the second interface of the semiconductor wafer manufacturing tool, a holding device configured within the housing for holding the wafer within the housing, and a measurement sensor configured for facing towards a surface of the wafer in order to interact with the surface of the wafer;
removing the wafer from the first pod;
placing the wafer into the chamber;
processing the wafer in the chamber;
placing the wafer into the holding device in the second pod at a time selected from a group consisting of before performing the step of processing the wafer and after performing the step of processing the wafer;
performing a measurement with the measurement sensor in the second pod; and
placing the wafer back into the first pod.

21. The method according to claim 20, which comprises:
obtaining a signal when carrying out the step of performing the measurement; and
controlling a parameter for the step of processing the wafer in response to the signal obtained when carrying out the step of performing the measurement.

* * * * *

UNITED STATES PATENT AND TRADEMARK OFFICE
CERTIFICATE OF CORRECTION

PATENT NO. : 6,884,639 B2
DATED : April 26, 2005
INVENTOR(S) : James Dougan et al.

It is certified that error appears in the above-identified patent and that said Letters Patent is hereby corrected as shown below:

<u>Title page,</u>
Item [73], Assignee, should read as follows:
-- Infineon Technologies AG, Munich (DE);
Motorola Inc., Schaumburg, IL (US);
Infineon Technologies SC300 GmbH & Co. KG, Dresden (DE) --

Signed and Sealed this

Fifth Day of July, 2005

JON W. DUDAS
*Director of the United States Patent and Trademark Office*